United States Patent
Shibayama

(10) Patent No.: US 7,696,620 B2
(45) Date of Patent: Apr. 13, 2010

(54) PHOTODIODE ARRAY, METHOD FOR MANUFACTURING SAME, AND RADIATION DETECTOR

(75) Inventor: Katsumi Shibayama, Hamamatsu (JP)

(73) Assignee: Hamamatsu Photonics K.K., Hamamatsu, Shizuoka (JP)

(*) Notice: Subject to any disclaimer, the term of this patent is extended or adjusted under 35 U.S.C. 154(b) by 153 days.

(21) Appl. No.: 10/548,413

(22) PCT Filed: Mar. 10, 2004

(86) PCT No.: PCT/JP2004/003090

§ 371 (c)(1),
(2), (4) Date: Jul. 31, 2006

(87) PCT Pub. No.: WO2004/082023

PCT Pub. Date: Sep. 23, 2004

(65) Prior Publication Data

US 2007/0090477 A1    Apr. 26, 2007

(30) Foreign Application Priority Data

Mar. 10, 2003   (JP)  ............................. 2003-063904

(51) Int. Cl.
*H01L 23/04* (2006.01)

(52) U.S. Cl. ............................. 257/698; 257/E27.133; 257/E25.032; 438/22; 438/45

(58) Field of Classification Search ............. 438/22–47; 257/431–470, E31.111, 80, 81, 82, E27.133, 257/E25.032, 698

See application file for complete search history.

(56) References Cited

U.S. PATENT DOCUMENTS

| | | | | |
|---|---|---|---|---|
| 4,857,980 | A | * | 8/1989 | Hoeberechts ............... 257/436 |
| 6,169,317 | B1 | | 1/2001 | Sawada et al. |
| 6,566,685 | B2 | * | 5/2003 | Morikawa et al. ............. 257/59 |
| 6,844,570 | B2 | * | 1/2005 | Sekine et al. ................. 257/80 |
| 6,952,049 | B1 | * | 10/2005 | Ogawa et al. ............... 257/700 |
| 2002/0153492 | A1 | | 10/2002 | Sekine et al. |
| 2003/0127724 | A1 | * | 7/2003 | Senba ........................ 257/698 |

FOREIGN PATENT DOCUMENTS

| | | |
|---|---|---|
| JP | 59-085188 | 5/1984 |
| JP | 01/290298 | 11/1989 |
| JP | 07-263733 | 10/1995 |
| JP | 11/044769 | 2/1999 |
| JP | 11-126892 | 5/1999 |

(Continued)

*Primary Examiner*—Khiem D Nguyen
(74) *Attorney, Agent, or Firm*—Drinker Biddle & Reath LLP

(57) ABSTRACT

A theme is to prevent the generation of noise due to damage in a photodetecting portion in a mounting process in a photodiode array, a method of manufacturing the same, and a radiation detector. In a photodiode array, wherein a plurality of the photodiodes (4) are formed in array form on the surface at a side of the n-type silicon substrate (3) onto which light to be detected is made incident and the penetrating wirings (8), which pass through from the incidence surface side to the back surface side, are formed for the photodiodes (4), the photodiode array (1) is arranged with the spacer (6), having a predetermined planar pattern, provided at non-forming regions of the incidence surface side at which the photodiodes (4) are not formed.

11 Claims, 18 Drawing Sheets

FOREIGN PATENT DOCUMENTS

| | | |
|---|---|---|
| JP | 11-297975 | 10/1999 |
| JP | 2001-318155 | 11/2001 |
| JP | 270808 | 9/2002 |
| JP | 2002/311146 | 10/2002 |
| JP | 2003-066150 | 3/2003 |
| JP | 2003-068779 | 3/2003 |

* cited by examiner

PHOTODIODE ARRAY, METHOD FOR MANUFACTURING SAME, AND RADIATION DETECTOR

TECHNICAL FIELD

This invention concerns a photodiode array, a method of manufacture thereof, and a radiation detector.

BACKGROUND ART

Among photodiode arrays, there is known since priorly a front surface incidence type photodiode array, wherein output signals from the photodiode array are electrically connected to the back surface side by means of penetrating wirings (electrodes) that connect a light-incident surface side and a back surface side (see, for example, Japanese Published Unexamined Patent Application No. 2001-318155). As shown in FIG. 18, with the photodiode array disclosed in this publication, wirings 152 are formed on a front surface of the photodiode array 144 to take out signals from the respective diffusion layers 151 where the photodiodes 144*a*, 144*b*, 144*c*, . . . 144*n*, which are the main bodies of a photoelectric conversion unit, are formed, and each wiring 152 is extended so as to be connected to the penetrating wiring 154 that passes through from the front to the back of the Si wiring substrate 153. Also at the back surface side of each photodiode 144 is formed the bump 155, connected to the penetrating wiring 154, and the intervals between the Si substrate 153 and the wirings 152 and the penetrating wirings 154 are insulated by the insulating films 156*a*, 156*b*, and 156*c*, which are silicon oxide films.

DISCLOSURE OF THE INVENTION

In mounting an above-described photodiode array, that is for example, the CT photodiode array, a flat collet or a pyramidal collet can be used as the collet for suctioning of the chip, and normally when flip-chip bonding is performed, a flat collet is used. The CT photodiode array is large in chip area (that is, for example, has a rectangular shape with one side being 20 mm in length), and as shown in FIG. 17B, when the pyramidal collet 161 that is normally used in a mounter is used, warping occurs due to the gap 163 that forms between the chip 162 and the pyramidal collet 161 and positional deviation may occur due to this warping and cause lowering of the mounting precision. Also, heating and pressurization are required in the process of flip-chip bonding, and with the pyramidal collet 161, the heat conduction efficiency is poor and the edges of the chip may become damaged due to the applied pressure. The pyramidal collet 161 is thus not suited for a thin chip. Due to these reasons, in performing flip-chip bonding, heat and pressure are applied to the chip 162 from a heater block 164 while the suctioning chip 162 by the flat collet 160 that comes in planar contact with the chip surface as shown in FIG. 17A.

However, when the flat collet 160 is used, the entire chip surface of the chip 162 contacts the flat collet 160. With this chip 162, the chip surface that contacts the flat collet 160 is the light-incident surface at which are formed the impurity diffusion layers that make up the photodetecting portion, that is, the photodiode array. If the entirety of this chip surface that is to be the light-incident surface is subject to pressurization and heating while being in contact with the flat collet 160, the photodetecting portion itself receives physical damage. Appearance defects and degradation of characteristics (increased dark current and noise, etc.) due to surface flaws thus occur at the photodetecting portion.

Thus an object of this invention is to provide a photodiode array, a manufacturing method thereof, and a radiation detector, with which the above issues are resolved and the degradation of characteristics due to damage of the photodiode array in the mounting process can be prevented.

In order to resolve the above object, this invention provides a photodiode array comprising: a semiconductor substrate, wherein a plurality of photodiodes are formed in array form on a surface onto which light to be detected is made incident; and is characterized in that the semiconductor substrate has penetrating wirings, which pass through from the incidence surface side to the back surface side, formed for the photodiodes and a protruding portion, having a predetermined height, is formed at regions of the incidence surface side at which the photodiodes are not formed.

With this photodiode array, a protruding portion is disposed at the non-formed regions and this protruding portion functions as a spacer that forms gaps with respect to a flat collet used in a mounting process. The photodiodes are thus protected and prevented from directly contacting the flat collet and will thus not receive stress due to pressurization and stress due to heating.

With the above-described photodiode array, the above-mentioned protruding portion may be formed of a resin or a metal with a light shielding property. Incidence of light onto the non-formed regions can thereby be prevented and the resolution of the photodiode will be improved.

Preferably with any of the above-described photodiode arrays, the protruding portion comprises a plurality of spacer units and the respective spacer units are formed so as to be positioned intermittently at predetermined intervals.

With this photodiode array, though the incidence surface side is partitioned by the protruding portion into a plurality of regions, since the respective regions are in communication with each other, when a resin is coated onto the incidence surface side, the resin will flow thoroughly among the respective regions and voids will not form readily inside the respective regions.

Also preferably with each of the above-described photodiode arrays, the semiconductor substrate has impurity regions (separation layers), which separate the respective photodiodes, disposed between the adjacent photodiodes. With these photodiode arrays, since surface leakage is restrained by the separation layers, the adjacent photodiodes are electrically separated securely.

This invention provides a photodiode array manufacturing method comprising: a first step of forming, in a semiconductor substrate, formed of a semiconductor of a first conductive type, penetrating wirings that pass through between the respective surfaces of the semiconductor substrate; a second step of adding an impurity to predetermined regions of a surface at one side of the semiconductor substrate to form a plurality of impurity diffusion layers of a second conductive type and forming a plurality of photodiodes arrayed in array form from the respective impurity diffusion layers and the semiconductor substrate; and a third step of providing on the surface at the one side of the semiconductor substrate, a protruding portion of predetermined height at the non-formed regions at which the photodiodes are not formed.

With this photodiode array manufacturing method, a photodiode array, having a protruding portion of predetermined height disposed at the non-formed regions of the incidence surface side of the semiconductor substrate, can be manufactured.

In the above-described photodiode array manufacturing method, the above-described first step may comprise: a step of forming a plurality of hole portions in the semiconductor substrate; a step of forming a conductive coating film on the surface of at least one side of the semiconductor substrate including the respective hole portions; and a step of polishing the semiconductor substrate to remove the conductive coating film.

With each of the above photodiode array manufacturing methods, subsequent the above-described first step, a step, of adding, between adjacent regions to which the impurity is to be added, another impurity to form impurity regions of the first conductive type, may be provided. With this manufacturing method, a photodiode array wherein adjacent photodiodes are separated securely can be provided.

Furthermore, this invention provides a radiation detector comprising: any of the above-described photodiode arrays; and a scintillator panel, mounted to the side of the photodiode array onto which the light to be detected is made incident and emits light due to incident radiation.

This invention also provides a radiation detector, comprising: the photodiode array manufactured by any of the above-described manufacturing methods; and a scintillator panel, mounted to the side of the photodiode array at which the protruding portion is provided and emits light due to incident radiation.

Since each of these radiation detectors is equipped with the above-described photodiode array, the photodiodes that are formed on the light-incident surface side are protected by the protruding portion at the non-formed regions and prevented from receiving damage due to pressurization and heating in the mounting process, and degradation of characteristics due to the increase of noise and dark current, etc. by such damage is thus prevented.

BRIEF DESCRIPTION OF THE DRAWINGS

FIGS. 15A and 16A are provided.

BEST MODES FOR CARRYING OUT THE INVENTION

Embodiments of this invention shall now be described. The same symbols shall be used for the same elements and redundant description shall be omitted.

Figure 1:
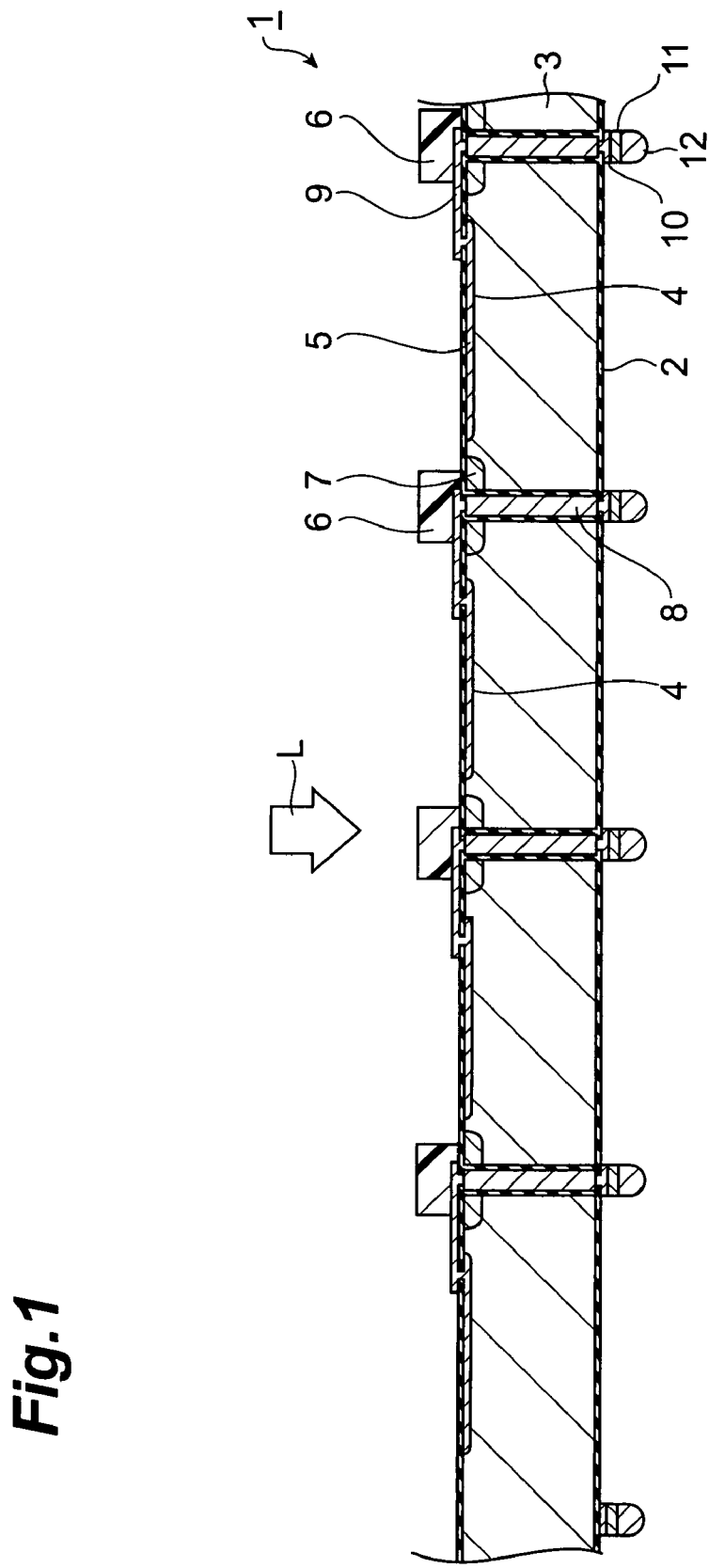
FIG. 1 is a sectional view showing, in enlarged and schematic manner, the principal portions of a photodiode array of an embodiment.

FIG. 1 is a sectional view showing, in enlarged and schematic manner, the principal portions of a photodiode array 1 of an embodiment of this invention. In the description that follows, the surface of incidence of light L shall be called as the front surface and the surface at the opposite side shall be called as the back surface. In the respective FIGURES, the dimensions are differed as suited for the convenience of illustration.

Photodiode array 1 has the plurality of photodiodes 4, formed of pn junctions that are arrayed two-dimensionally in a regular array form in the vertical and horizontal directions, and each photodiode 4 functions as a single pixel of photodiode array 1, which, as a whole, makes up a single photodetecting portion.

The photodiode array 1 has the n-type. (first conductive type) silicon substrate 3 with a thickness of approximately 150 to 500 µm (preferably 400 µm) and an impurity concentration of approximately $1 \times 10^{12}$ to $10^{15}$/cm$^3$. The passivation films 2, formed of SiO$_2$ of a thickness of approximately 0.05 to 1 µm (preferably 0.1 µm), are formed on the front surface and back surface of the n-type silicon substrate 3. Also the photodiode array 1 has, on its front surface side, the p-type (second conductive type) impurity diffusion layer 5, with an impurity concentration of approximately $1 \times 10^{15}$ to $10^{20}$/cm$^3$ and a film thickness of 0.05 to 20 µm (preferably 0.2 µm), arrayed in a regular array form horizontally and vertically. The pn junctions, formed by the respective p-type impurity diffusion layers 5 and the n-type silicon substrate 3, make up the photodiodes 4.

The regions at which the respective p-type impurity diffusion layers 5 exist are the regions at which the photodiodes 4 are formed (formed regions), the regions besides these are non-formed regions where photodiodes are not formed, and at the non-formed regions of the front surface side is disposed a spacer 6, which is a protruding portion having a predetermined pattern. This spacer 6 is formed of a resin, metal, or insulating material and protrudes to a predetermined height (in the present embodiment, this height is set to a suitable height (thickness) from the front surface n-type silicon substrate 3 that is greater than the film thickness of the electrode wirings 9 to be described later).

The photodiode array 1 also has the penetrating wiring 8 provided for each photodiode 4. Each penetrating wiring 8 passes through from the front surface side to the back surface side of the n-type silicon substrate 3, is formed to a diameter of approximately 10 μm to 100 μm (preferably approximately 50 μm), is formed of polysilicon with a phosphorus concentration of approximately $1 \times 10^{15}$ to $10^{20}/cm^3$, has its front surface side electrically connected to the p-type impurity diffusion layer 5 via the electrode wiring 9 (with a film thickness of approximately 1 μm) formed of aluminum, and has its back surface side electrically connected to the electrode pad 10 (with a film thickness of 0.05 μm to 5 μm and preferably approximately 1 μm) formed likewise of aluminum. To each electrode pad 10, the solder bump electrode 12 is connected via an under-bump metal (UBM) 11, formed of Ni—Au. Though each penetrating wiring 8 is disposed in a non-formed region at which the photodiode 4 is not formed, it may be disposed in another portion instead.

The illustrated photodiode array 1 furthermore has $n^+$-type impurity regions (separation layers) 7 provided to a depth of approximately 0.5 to 6 μm between the p-type impurity diffusion layers 5, that is, between the adjacent photodiodes 4. This $n^+$-type impurity region (separation layer) 7 has a function of electrically separating the adjacent photodiodes 4, and thus by the provision thereof, the adjacent photodiodes 4 are electrically separated securely and crosstalk among the photodiodes 4 can be reduced. However, even without the provision of the $n^+$-type impurity regions 7, the photodiode array 1 has photodetecting characteristics that are adequately allowable in terms of practical use.

Figure 2:
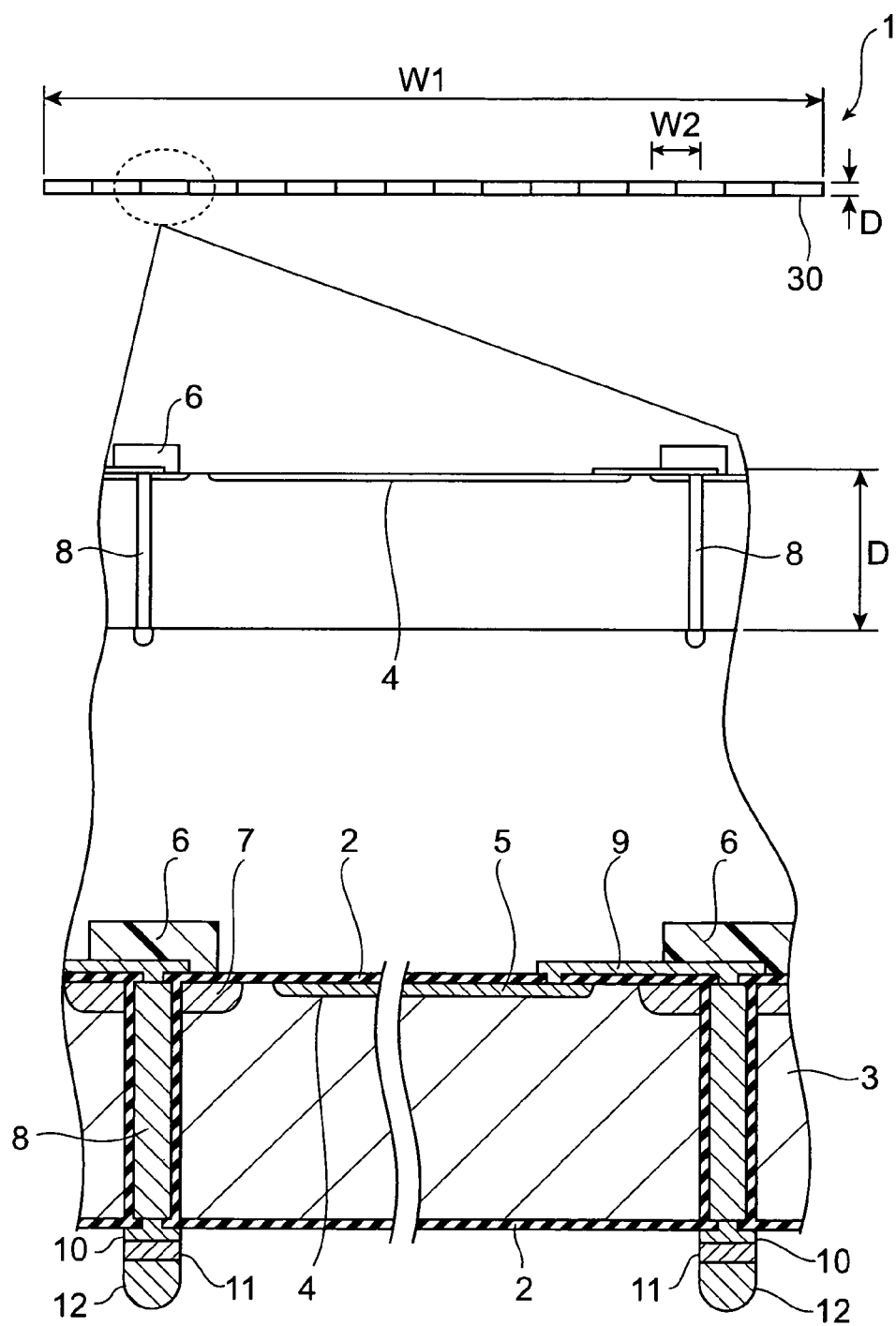
FIG. 2 shows a side view of a semiconductor chip that makes up the photodiode array and sectional views showing the principal portions thereof in enlarged manner.

FIG. 2 shows a side view of the semiconductor chip 30 that makes up the photodiode array 1 and sectional views showing the principal portions thereof in enlarged manner. As shown in FIG. 2, the semiconductor chip 30 has an extremely thin, plate-like form with a width W1 of approximately 22.4 mm and a thickness D of approximately 0.3 mm, has a plurality of the above-described photodiodes 4 (for example, has a two-dimensional array of 16×16 photodiodes), and is a large area (for example, approximately 22.4 mm×22.4 mm) chip wherein pitch W2 between adjacent pixels is approximately 1.4 mm.

With the photodiode array 1 arranged as described above, when light L is made incident from the front surface side, this light L to be detected is made incident on the respective p-type impurity diffusion layers 5, and carriers corresponding to the incident light are generated by the respective photodiodes 4. The photocurrents due to the generated carriers are taken out from the bump electrodes 12 via the electrode wirings 9 and the penetrating wirings 8, connected to the respective p-type impurity diffusion layers 5 and furthermore via the respective electrodes pads 10 and the UBMs 11 at the back surface side. The incident light is detected by these outputs from the bump electrodes 12.

As described above, the photodiode array 1 has spacer 6 provided at the non-formed regions. When the semiconductor chip 30 is suctioned by a flat collet to be flip-chip bonded, this spacer 6 contacts the flat collet and functions to secure gaps between the formed regions of the photodiodes 4, which make up the photodetecting portion, and the flat collet. The formed regions are thus protected by the spacer 6 and will not contact the flat collet directly. With the photodiode array 1, since the photodetecting portion thus does not directly receive stress due to pressurization or stress due to heating, the photodetecting portion itself will not receive physical damage and the generation of noise and dark current due to such damage can be restrained. The photodiode array 1 can thus perform photodetection of high precision (high S/N ratio).

Also besides flip-chip bonding, for example, when photodiode array 1 is integrated with a scintillator and used as a CT sensor as shall be described later, since the scintillator will not contact the photodetecting portion directly, damage in the process of mounting the scintillator can also be avoided.

Since as described above, the spacer 6 contacts the flat collet directly and is pressurized and heated when flip-chip bonding is performed, it is preferably provided using a material that can exhibit a protective function that enables protection of the respective photodiodes 4 from the pressurization and the heating.

For example, when the spacer 6 is formed of resin, in consideration of the thermal expansion coefficient, flexibility, elastic characteristics, and conditions such as impurity ions not diffusing into the respective photodiodes 4 due to heating, etc. an epoxy resin, a polyimide resin, a silicone resin, a urethane resin, an acrylic resin, a fluorine resin, or a composite material having these resins as base materials is used and the film thickness is set to 2 to 30 μm (preferably 5 to 6 μm). When the spacer 6 is provided using such a resin, the surface protection effect in the process of mounting the photodiode array 1 will be high. Moreover, the spacer 6 will not affect the electrical characteristics of the photodiodes 4 and the manufacturing method will be simple. A polyimide resin is especially favorable in having good heat resistance and not degrading due to the heat that can be received from the flat collet in the mounting process. A light shielding property may also be provided to the resin of the spacer 6 by the addition of a filler.

The spacer 6 may be formed of metal, and in this case, a metal with a light shielding property is preferable. For example, Al (aluminum), Au (gold), Ni (nickel), Cr (chromium), Ti, or a silicide-based metal, etc. can be used and such metals may be laminated together. When such a metal is used to provide the spacer 6, since the light that is made incident between pixels is blocked, the resolution of the photodiode array is improved, and since the heat radiation characteristics can also be improved, noise and erroneous operation due to heat can be restrained. The effects may be significant depending on the planar pattern (to be described in detail later) of the spacer 6. Also, for example when the spacer 6 is formed as laminated films of Al and Ni plating, preferably, the film thickness of the former is set to approximately 1 μm and the film thickness of the latter is set to approximately 5 μm. If in the case where the spacer 6 is to be formed of metal, the electrode wirings 9 exist at a layer below the spacer 6, shorting among photodiodes may occur and cause a problem, a film having an insulating property is disposed between the spacer 6 and the electrode wirings 9.

Furthermore, an insulating material can be used for the spacer 6, and in this case, glass ($SiO_2$), SiN, low melting point glass, etc. can be used.

In providing the spacer 6 at the non-formed regions, various patterns may be considered for the planar pattern thereof (if a planar view of the photodiode array 1 is assumed, the spacer 6 is formed in a predetermined pattern on the front surface of the photodiode array 1 and this pattern shall be referred to as the "planar pattern"), and for example, the planar patterns shown in FIGS. 15A to C and 16A to C can be considered. Here, each of FIGS. 15A to C and 16A to C is a schematic planar view of the photodiode array 1 as viewed from the light-incident surface.

Figure 15A:
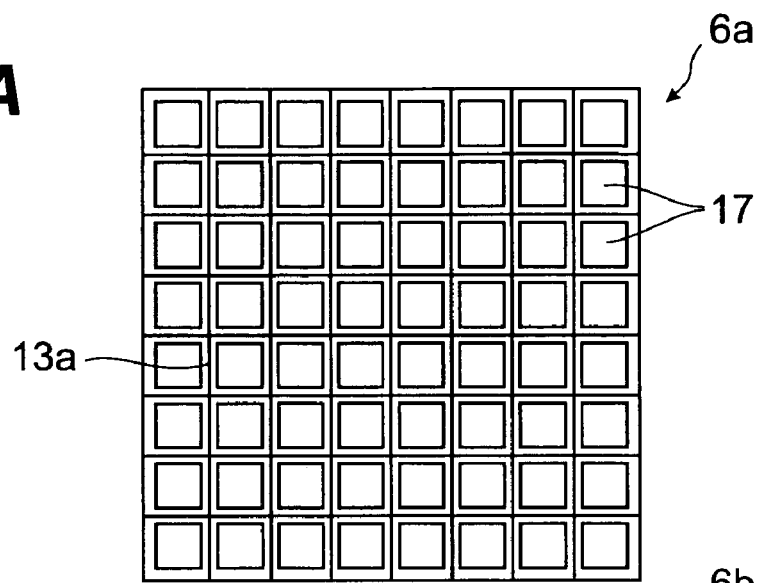
FIG. 15A is a schematic plan view of a photodiode array of an embodiment and illustrates a case where a spacer is formed in a continuous cross-like pattern.
Figure 15B:
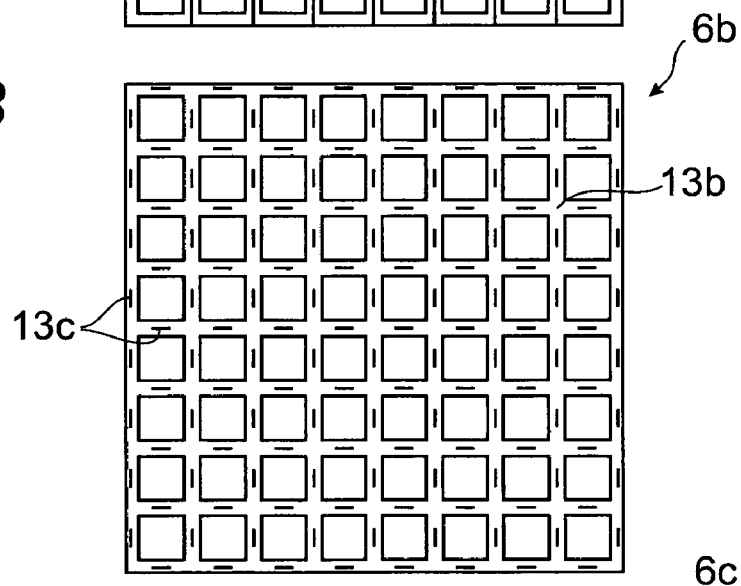
FIG. 15B is a schematic plan view of a photodiode array of an embodiment and illustrates a case where a spacer is formed in an intermittent pattern.
Figure 15C:
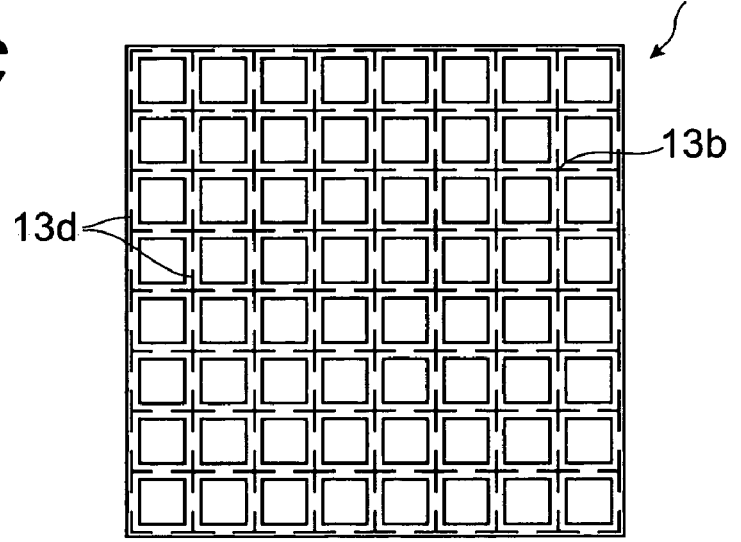
FIG. 15C is a schematic plan view of a photodiode array of an embodiment and illustrates a case where a spacer is formed in an intermittent cross-like pattern.

As shown in FIG. 15A, the spacer 6 may be formed in a continuous cross-like pattern 6a by positioning a plurality of long, continuous, wall-like spacer units 13a in a regular manner in the vertical and horizontal directions and intersecting these in cross-like form. Also as shown in FIG. 15B, an intermittent pattern 6b may be formed by intermittently positioning a plurality of short, wall-like spacer units 13c at predetermined intervals at portions besides corner portions 13b of the non-formed regions, or as shown in FIG. 15C, an intermittent cross-like pattern 6c may be obtained by positioning a plurality of cross-like spacer units 13d at the respective corner portions 13b.

Though these planar patterns are all regular patterns that can be obtained by positioning a plurality of spacer units in a regular manner, an irregular pattern may be formed instead by setting the mutual positioning intervals of the short, wall-like spacer units 13c or the cross-like spacer units 13d in an irregular manner.

Though when the spacer 6 is provided in a planar pattern such as those described above, a plurality of pixel regions 17, which are partitioned by the spacer 6, are formed at the front surface side, the adjacent pixel regions 17 are preferably in communication with each other and not partitioned completely by the spacer 6. For this purpose, the spacer 6 is, for example, provided in a planar pattern in which the spacer units are positioned intermittently as in the above-described intermittent pattern 6b or the intermittent cross-like pattern 6c.

Figure 16A:
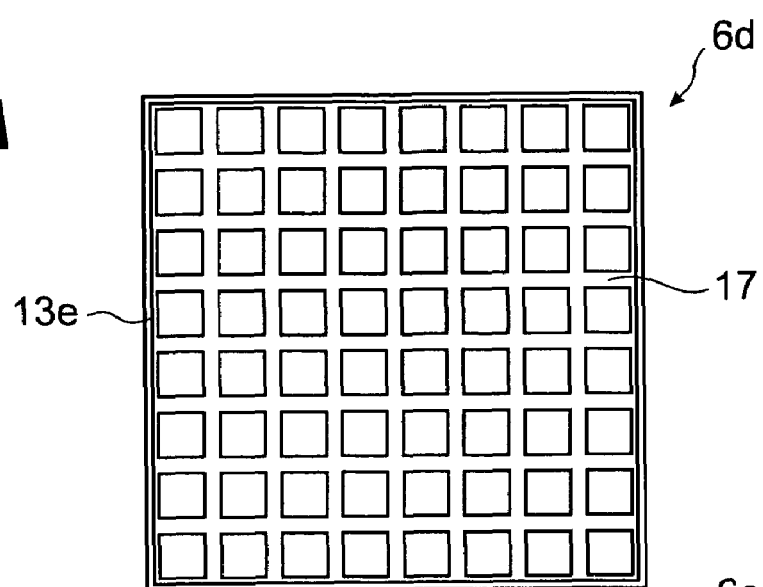
FIG. 16A is another schematic plan view of a photodiode array of an embodiment and illustrates a case where a spacer is formed in a frame-like pattern.
Figure 16B:
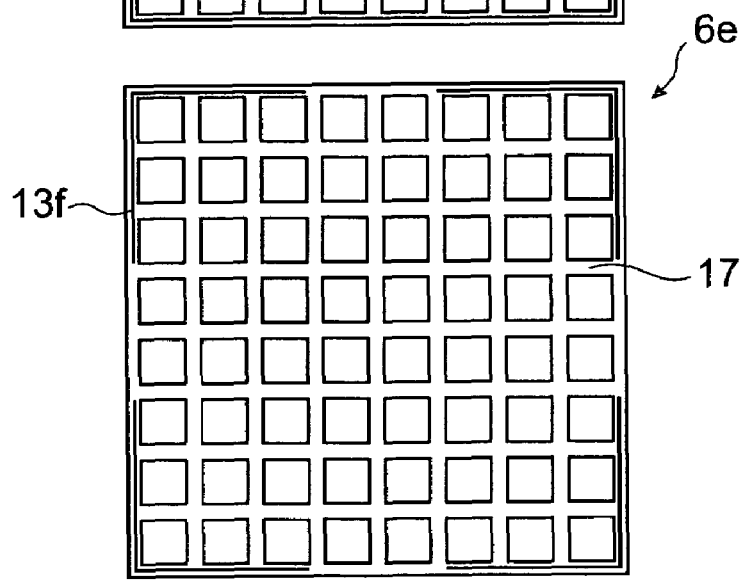
FIG. 16B illustrates a case where a frame-like pattern is formed with the frame-like spacer units of FIG. 16A that are partially omitted.

Also, in place of making the adjacent pixel regions 17 communicate with each other, the spacer 6 may be formed, for example, in a frame-like pattern 6d by positioning a rimmed frame-like spacer units 13e at positions by which the entire formed regions of the photodiodes 4 can be surrounded and the pixel regions 17 may be disposed in the interior as shown in FIG. 16A. In this case, in place of the frame-like spacer units 13e, frame-like spacer units 13f with omitted portions may be provided to form a frame-like pattern 6e as shown in FIG. 16B. In either case, the pixel regions 17 are formed without being partitioned from each other by the spacer 6.

When a plurality of the pixel regions 17 are thus formed and the spacer 6 is provided as a planar pattern by positioning a plurality of spacer units intermittently so that the adjacent pixel regions 17 will be in communication with each other without being partitioned, the gaps between the adjacent spacer units function as relief paths for resin (for example, an optical resin 35 that is used to adhere a scintillator panel 31 to form a radiation detector 40 as shall be described later). Thus when a resin is coated onto the front surface side of the n-type silicon substrate 3, voids (pores) will not form readily (voids will be lessened) in the pixel regions 17 and the coated resin can be made to flow without bias and uniformly fill the respective pixel regions 17.

Figure 16C:
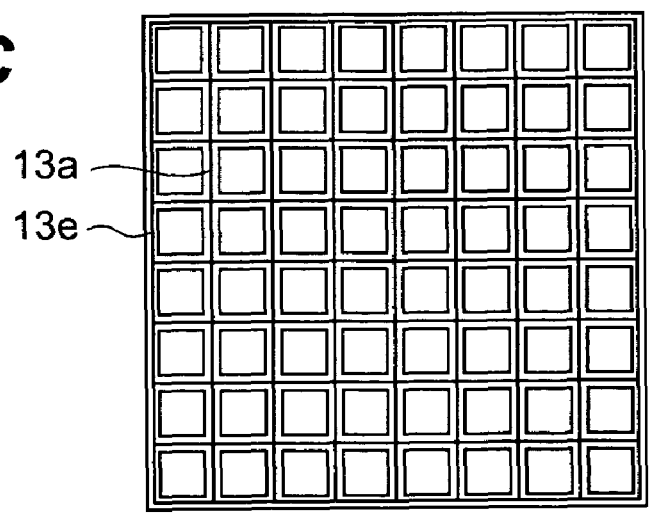
FIG. 16C illustrates a case where the spacer units of both
Figure 17A:
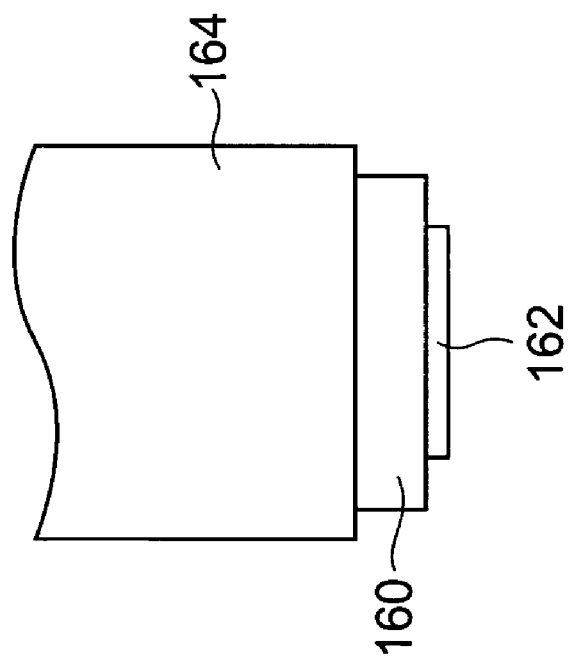
FIG. 17A is a sectional view schematically showing a state wherein a semiconductor chip is suctioned by a collet and shows a state of suctioning by a flat collet.
Figure 17B:
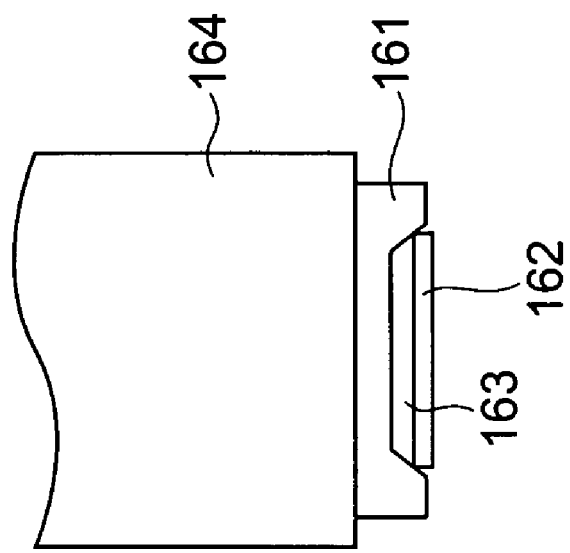
FIG. 17B is a sectional view schematically showing a state wherein a semiconductor chip is suctioned by a collet and shows a state of suctioning by a pyramidal collet.
Figure 18:
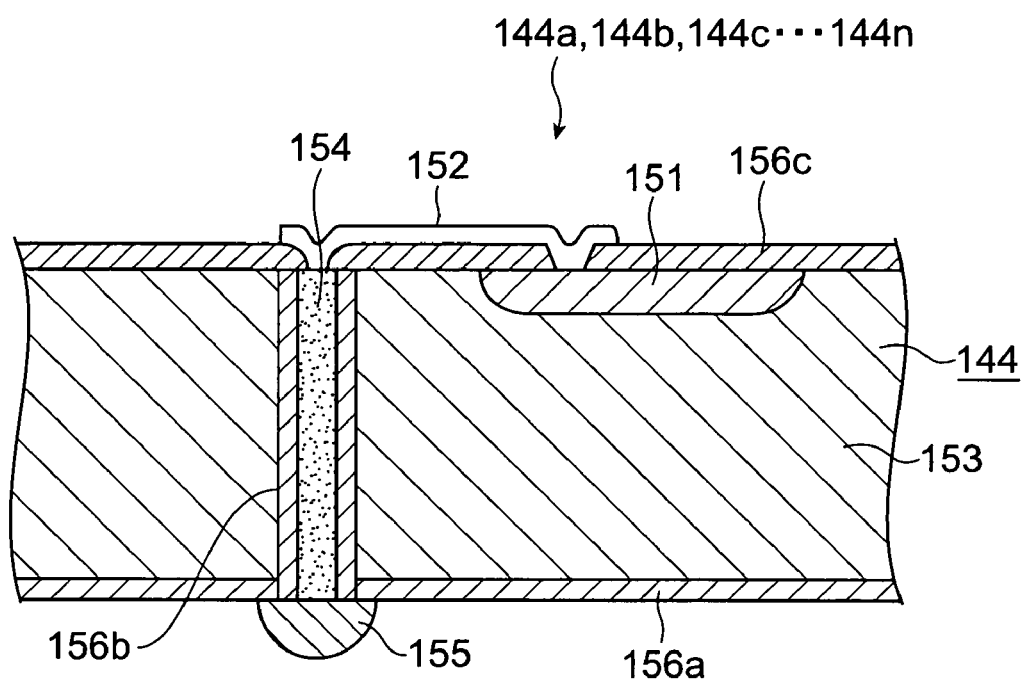
FIG. 18 is a sectional view showing a photodiode array of a conventional art.

Though the spacer 6 may be provided in a planar pattern having both the wall-like spacer units 13a and the frame-like spacer units 13e as shown in FIG. 16C, in this case, the respective pixel regions 17 are partitioned by the spacer 6. In this case, if the spacer 6 with a light shielding property is applied, since all of the pixel regions 17 will be partitioned uniformly by the spacer 6, the structure that is formed can be said to be suitable for improving the resolution of the photodiode array.

Figure 11:
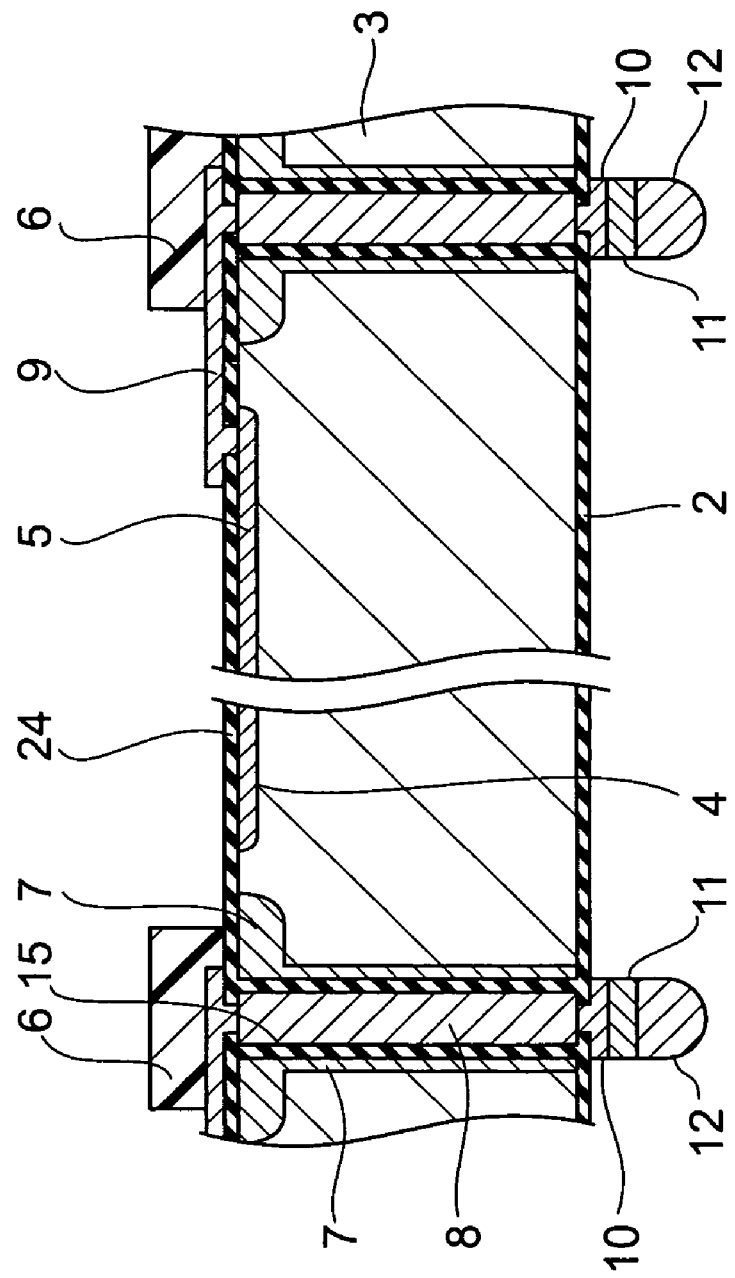
FIG. 11 is a sectional view showing, in enlarged and schematic manner, the principal portions of another photodiode array of an embodiment.

The above-described photodiode array 1 may also be arranged as follows. That is, for example as shown in FIG. 11, phosphorus may be diffused in side walls of the pore portions 15 to provide the $n^+$-type impurity regions 7 at the surroundings of the penetrating wirings 8 as well. Unnecessary carriers from damaged layers formed in the process of forming the pore portions 15 (hole portions 14) can thereby be trapped to restrain the dark current. The concentration of phosphorus to be added in this case is set to approximately $1\times10^{15}$ to $10^{20}/cm^3$ and the thickness (depth) of each $n^+$-type impurity region 7 is set to approximately 0.1 to 5 μm.

Figure 12:
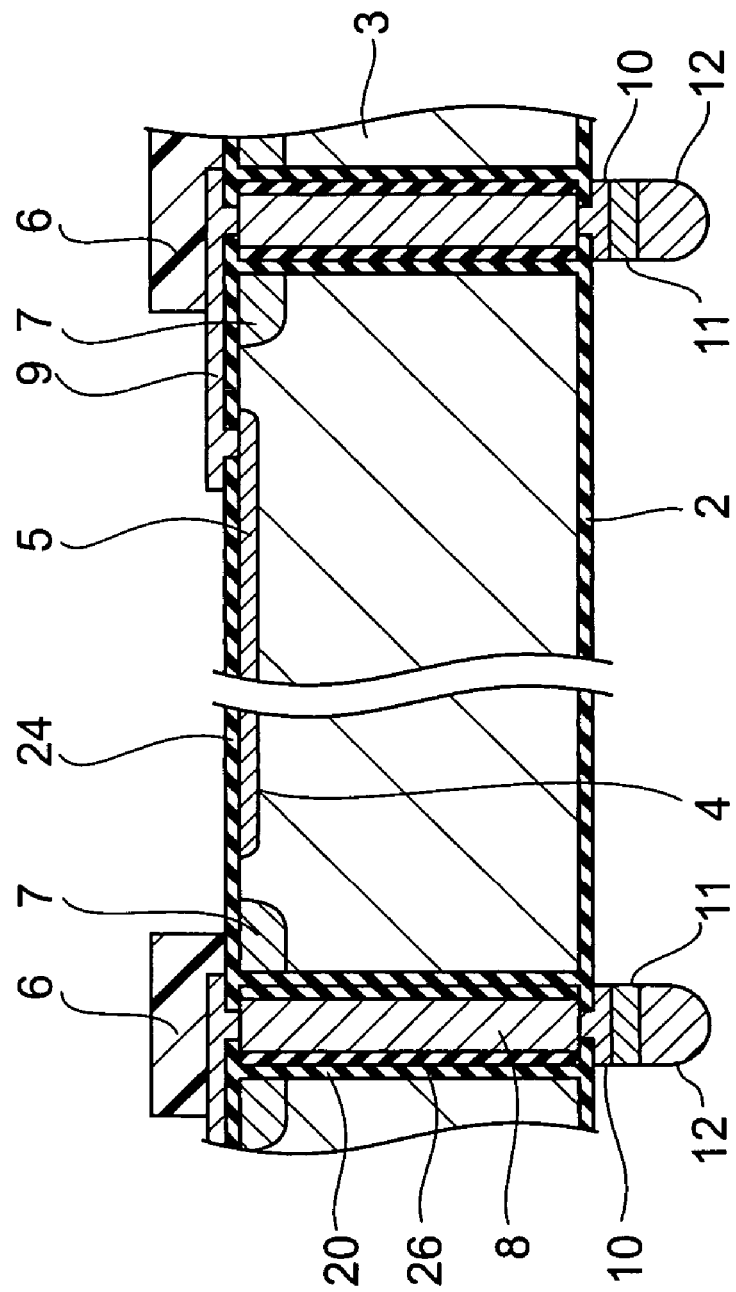
FIG. 12 is a sectional view showing, in enlarged and schematic manner, the principal portions of yet another photodiode array of an embodiment.

Also as shown in FIG. 12, a silicon nitride film 26 with a film thickness of approximately 0.1 to 2 μm may be disposed on a silicon oxide film 20 inside each pore portion 15 as shown in FIG. 12. By doing so, the insulation between n-type silicon substrate 3 and penetrating wirings 8 can be secured to reduce operation faults.

Figure 13:
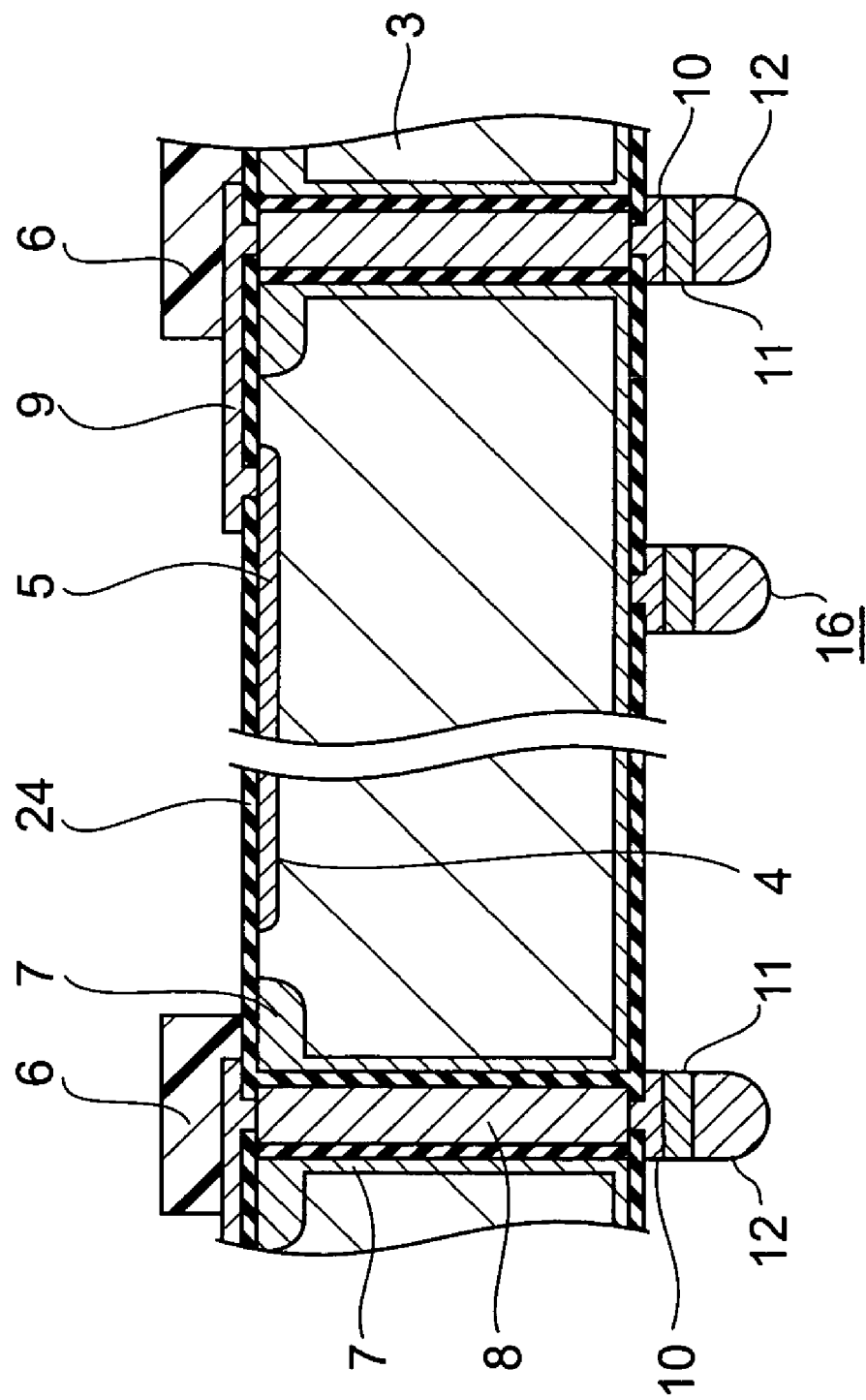
FIG. 13 is a sectional view showing, in enlarged and schematic manner, the principal portions of yet another photodiode array of an embodiment.

Furthermore, the $n^+$-type impurity regions 7 may also be provided at the back surface side by doping and diffusing phosphorus as shown in FIG. 13. In this case, cathode electrodes 16 can be led out from the back surface. By doing so, the need to provide penetrating wirings for the cathode is eliminated, thus leading to the lowering of damage, the lowering of dark current, and the lowering of the percent defective. Needless to say, electrodes to serve as cathodes may also be disposed at the back surface side upon providing penetrating wirings from the $n^+$-type impurity regions 7 formed on the front surface.

Figure 3:
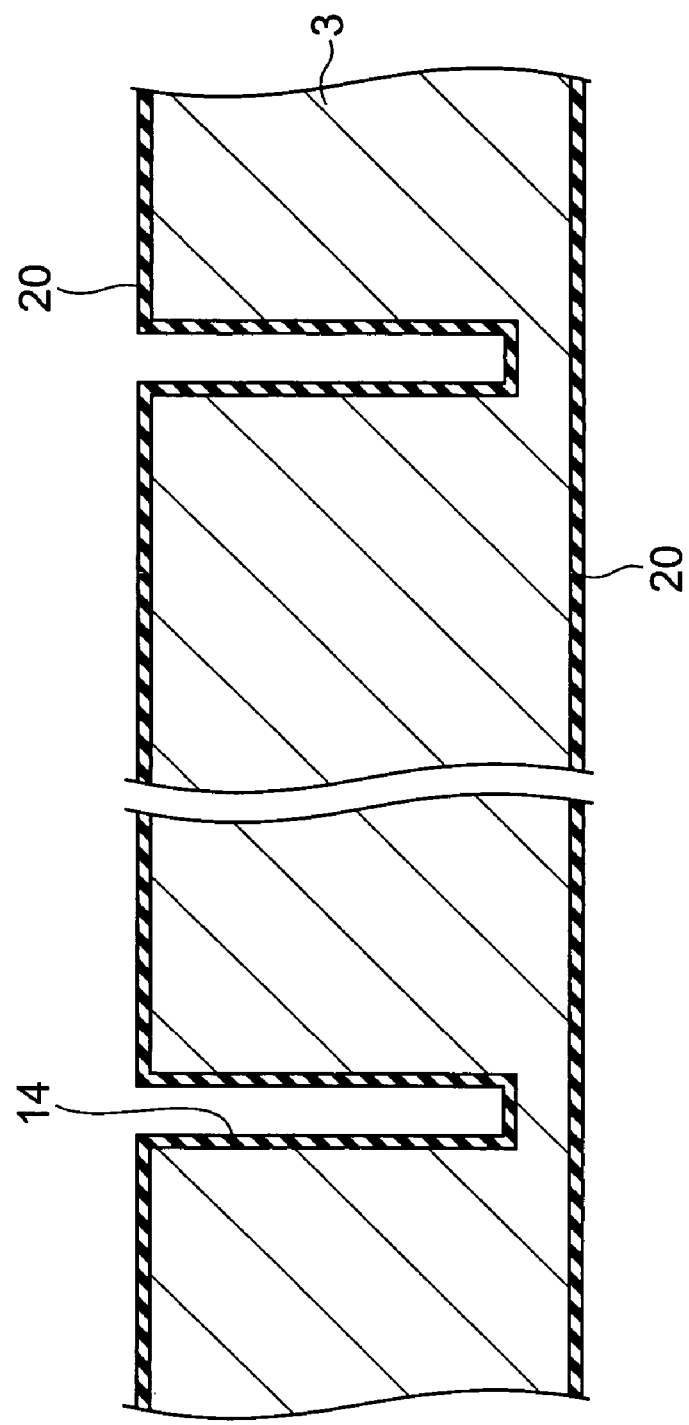
FIG. 3 is an enlarged sectional view of the principal portions that illustrates an intermediate step in a process of manufacturing the photodiode array of the embodiment.

A method of manufacturing the present embodiment's photodiode array 1 shall now be described with reference to FIGS. 3 to 10. First, the n-type silicon substrate 3 with a thickness of approximately 150 to 500 μm (preferably 400 μm) is prepared. Then as shown in FIG. 3, by ICP-RIE, a plurality of the hole portions 14, which are of a diameter of approximately 10 μm to 100 μm (preferably 50 μm) and do not pass through, are formed in correspondence to the photodiodes 4 to a depth (for example of approximately 100 to 350 μm) that is in accordance to the thickness of the n-type silicon substrate 3 at a surface at one side (this surface shall hereinafter be the front surface and the surface at the opposite side shall be the back surface) of the n-type silicon substrate 3, and thereafter the front surface and the back surface of the substrate are thermally oxidized to form the silicon oxide films ($SiO_2$) 20. In each hole portion 14, the penetrating wiring 8 is formed in a later step. The silicon oxide film ($SiO_2$) 20 realizes the electrical insulation between the penetrating wirings 8 to be described later and n-type silicon substrate 3.

Figure 4:
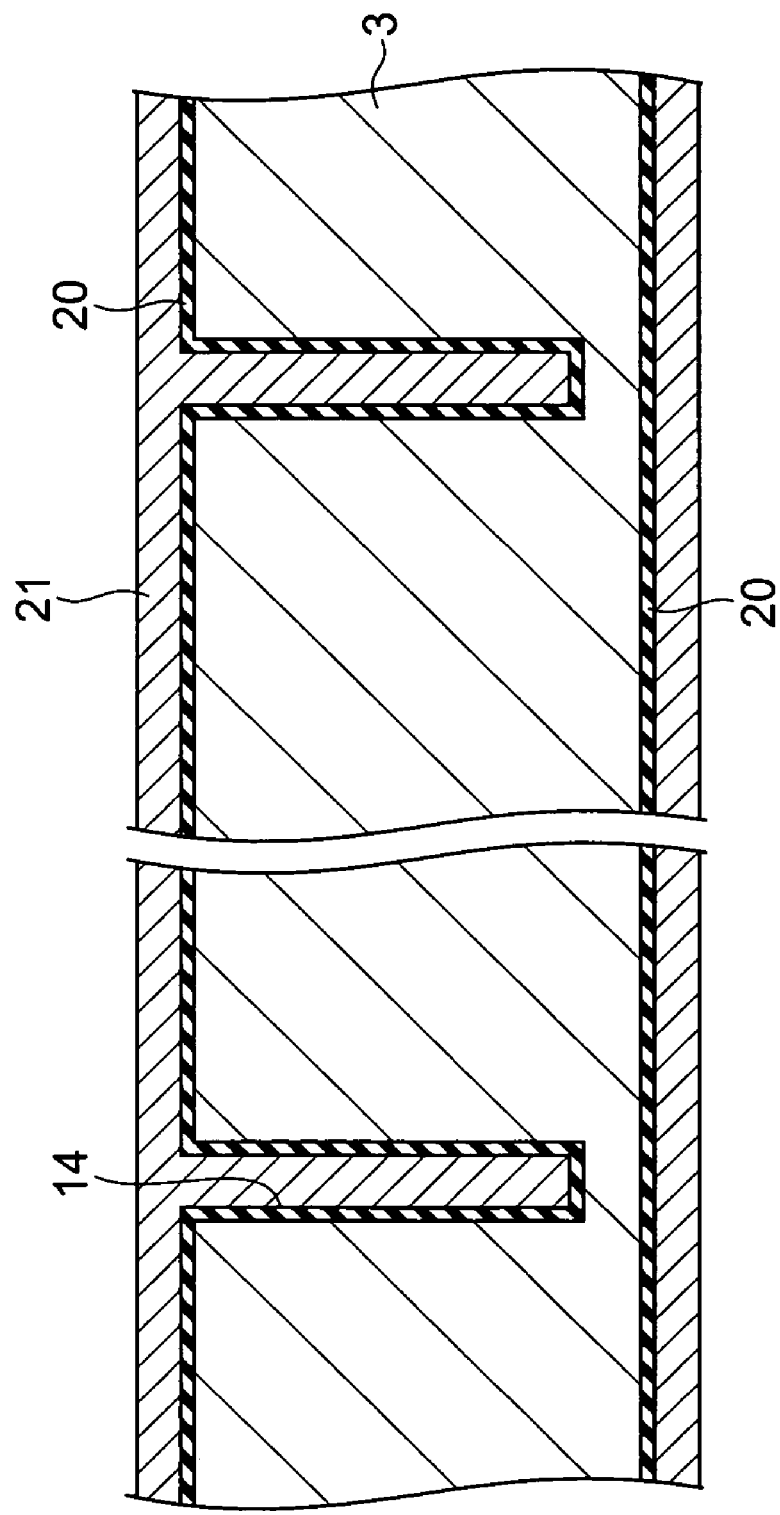
FIG. 4 is an enlarged sectional view of the principal portions that illustrates a step subsequent that of FIG. 3.
Figure 5:
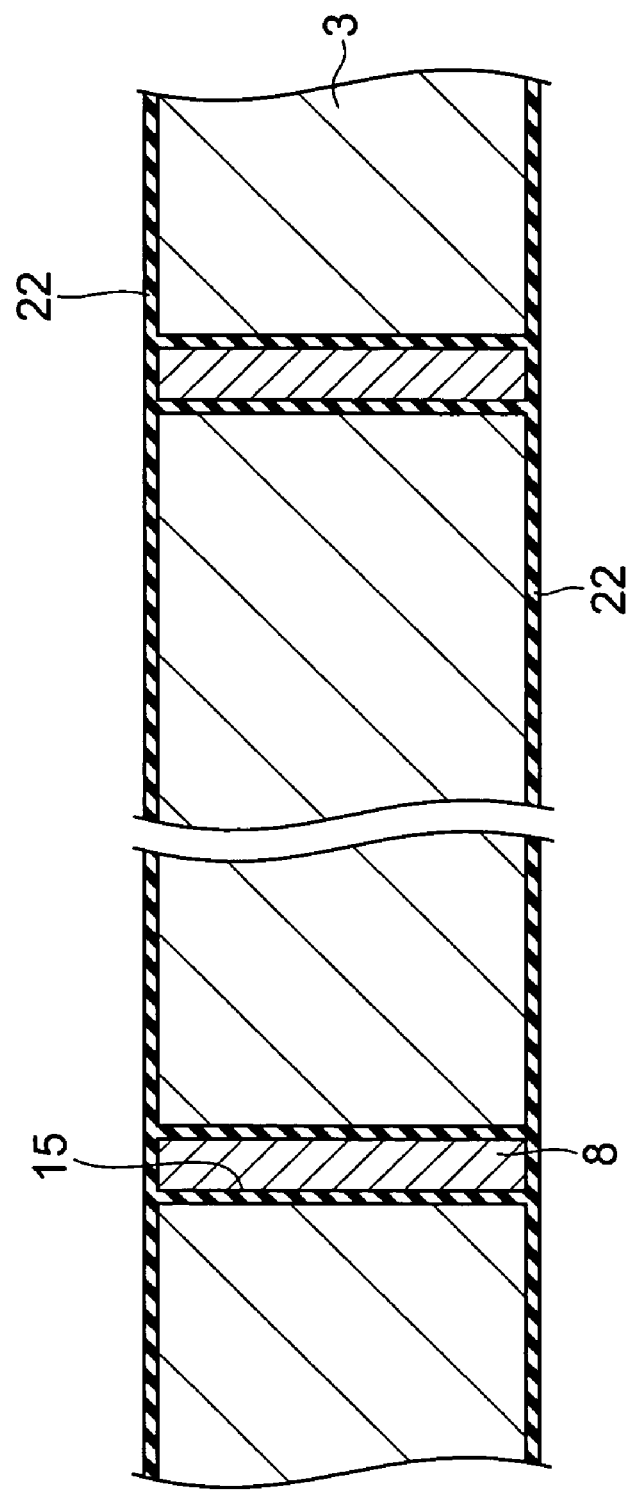
FIG. 5 is an enlarged sectional view of the principal portions that illustrates a step subsequent that of FIG. 4.

Then, as shown in FIG. 4, at the same time as forming a polysilicon film 21 on the front surface and the back surface or just the front surface of the substrate as a conductive coating film having phosphorus added as an impurity, the hole portions 14 are filled by polysilicon that has been made low in resistance by the addition of the impurity. Subsequently as shown in FIG. 5, the front surface and the back surface or just the front surface of the substrate are polished to remove the polysilicon film 21 that had been formed on the front surface and the back surface or just the front surface and expose the polysilicon embedded in the hole portions 14 at the front surface and the back surface and thereby form pore portions 15 passing through between the surfaces at both sides and make the embedded polysilicon become the penetrating wirings 8. The front surface and the back surface of the substrate are then thermally oxidized again to form a silicon oxide films 22. These silicon oxide films 22 are used as $n^+$ thermal diffusion masks in a subsequent step.

The silicon oxide film 22 at the front surface side of the n-type silicon substrate 3 is then patterned using a predetermined photomask to open just the regions at which the $n^+$-type impurity regions 7 are to be provided, and phosphorus is diffused from the opened portions (open portions) to provide the $n^+$-type impurity regions 7 (in the case where the $n^+$-type impurity regions 7 are not to be provided this step (impurity region forming step) may be omitted). Thereafter, the front surface and the back surface of the substrate are thermally oxidized again to form the silicon oxide films 23

Figure 6:
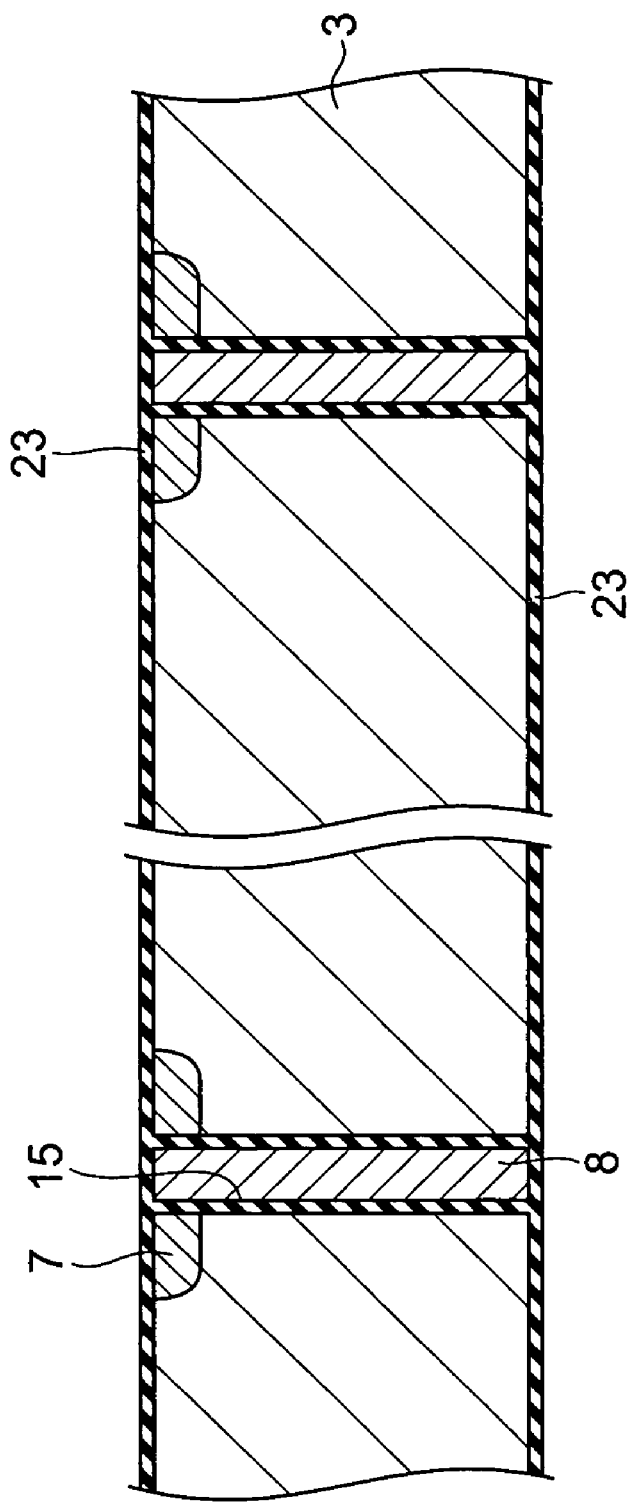
FIG. 6 is an enlarged sectional view of the principal portions that illustrates a step subsequent that of FIG. 5.
Figure 7:
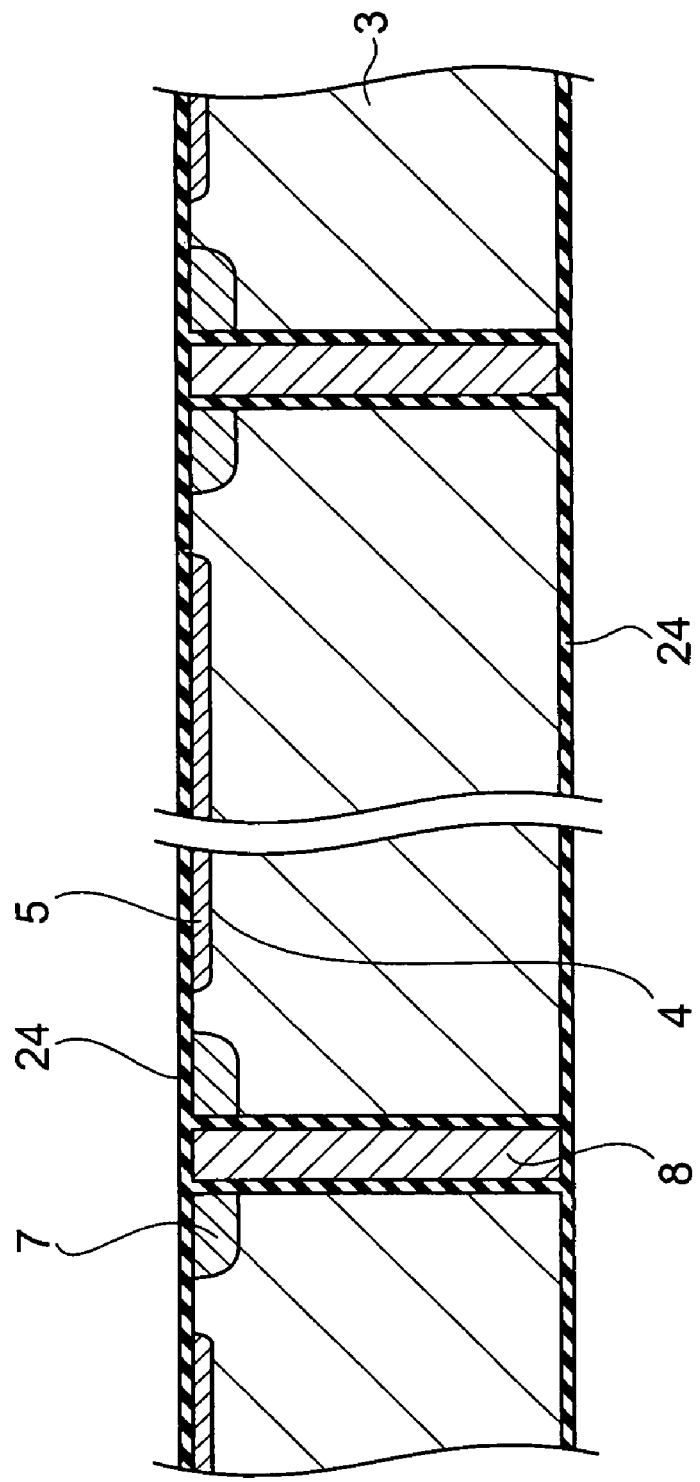
FIG. 7 is an enlarged sectional view of the principal portions that illustrates a step subsequent that of FIG. 6.
Figure 8:
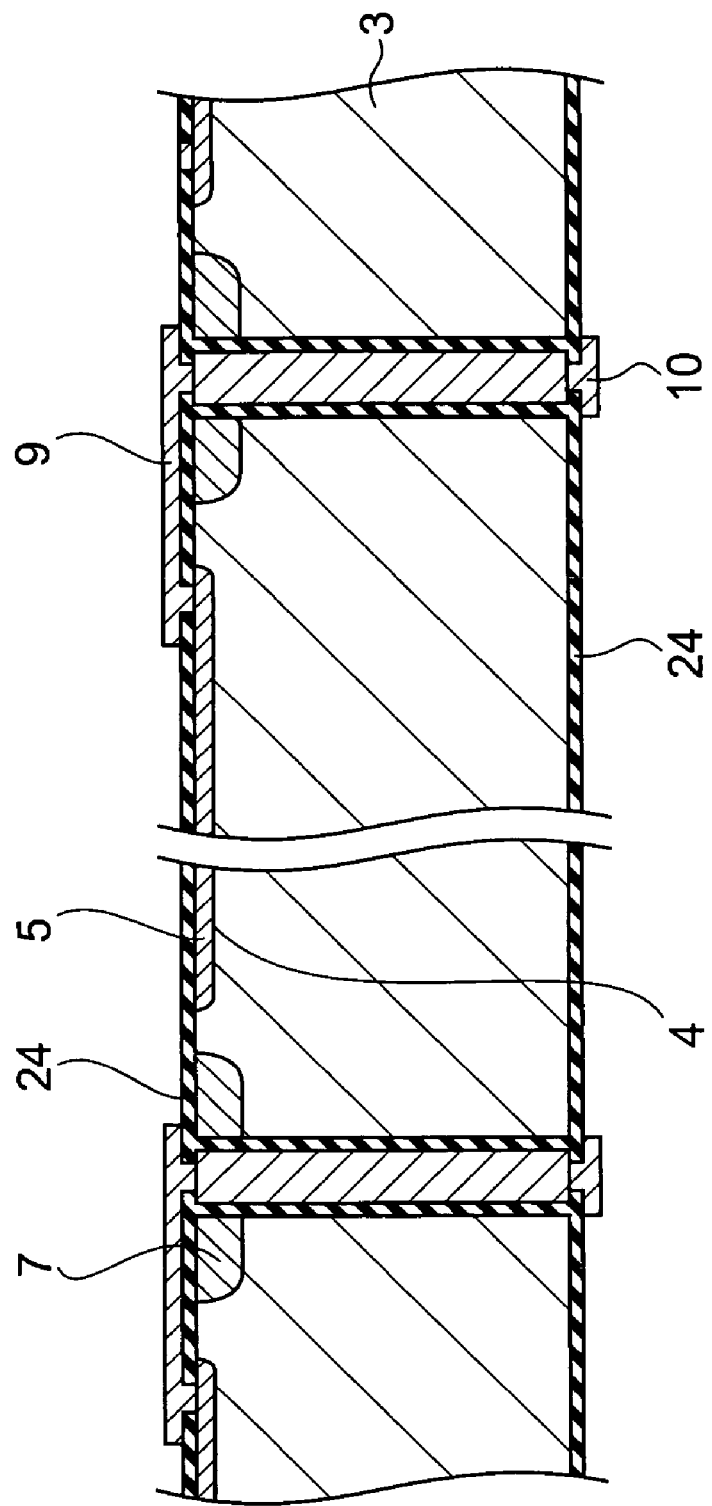
FIG. 8 is an enlarged sectional view of the principal portions that illustrates a step subsequent that of FIG. 7.

(see FIG. 6). These silicon oxide films 23 are used as masks in the process of forming the p-type impurity diffusion layers 5.

Patterning using a predetermined photomask is then performed on the silicon oxide film 23 and just the regions at which the p-type impurity diffusion layers 5 are to be formed are opened. Boron is then diffused from the opened portions and the p-type impurity diffusion layers 5 are formed so as to be arrayed vertically and horizontally in a two-dimensional array. Thereafter, the front surface and the back surface of the substrate are thermally oxidized again to form silicon oxide films 24 (see FIG. 7). The photodiodes 4, formed by the pn junctions of the respective p-type impurity diffusion layers 5 and the n-type silicon substrate 3 are thus formed so as to be arrayed vertically and horizontally in a two-dimensional array and these photodiodes 4 become portions corresponding to pixels.

Contact holes are then formed at the regions at which the respective penetrating wirings 8 are formed. Subsequently, upon forming aluminum metal films over the entire front surface and back surface, patterning is performed using a predetermined photomask and unnecessary portions of the metal film are removed to form the electrode wirings 9 at the front surface side and the electrode pads 10 at the back surface side (see FIG. 8). In the FIGURE, just the anode electrode lead-out portions are shown. Though not illustrated, to lead out cathode electrodes from a surface, electrodes can be lead out from the n$^+$-type impurity regions 7 to the back surface via the electrode wirings 9 and penetrating wirings 8.

Figure 9:
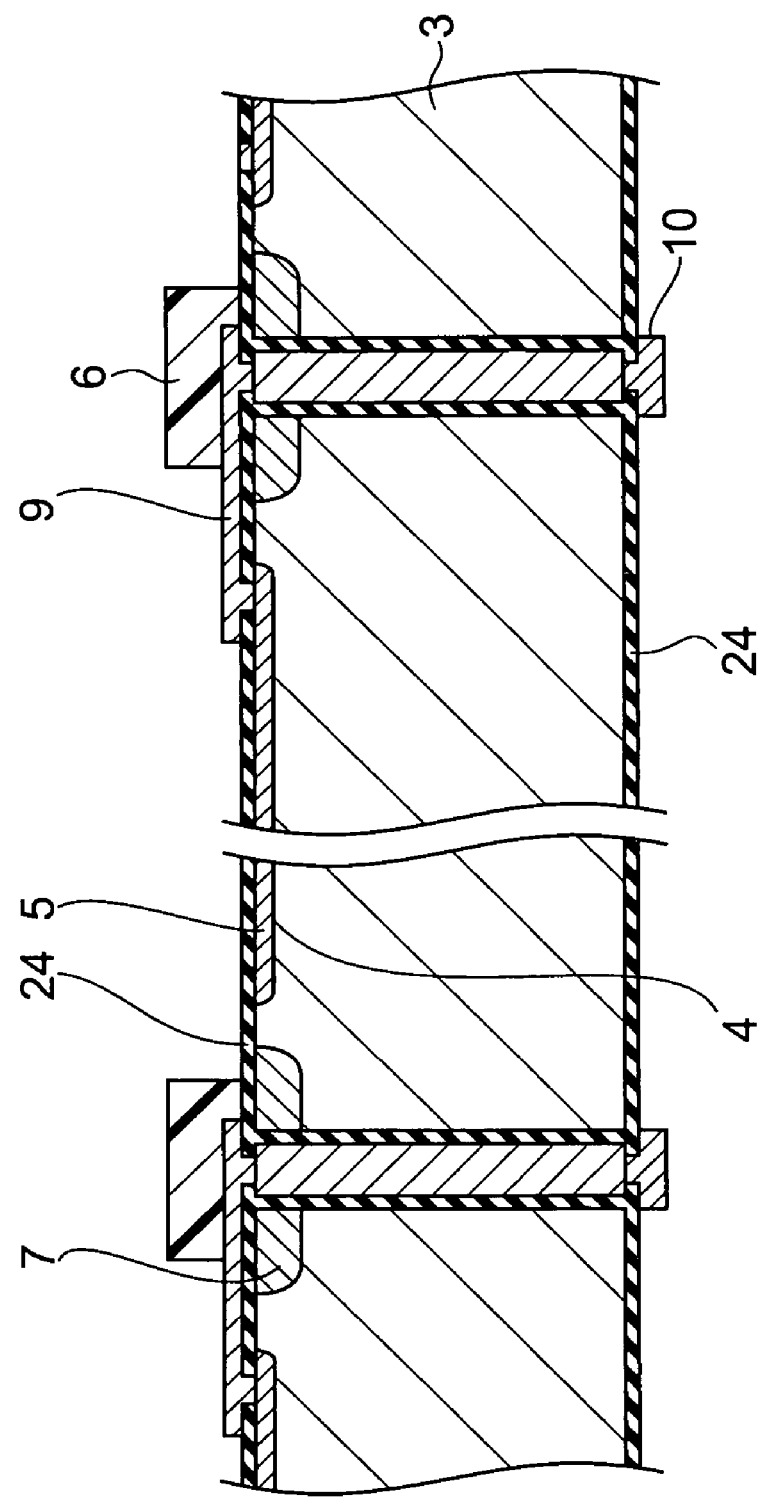
FIG. 9 is an enlarged sectional view of the principal portions that illustrates a step subsequent that of FIG. 8.

The spacer 6 is then formed on the front surface side of the n-type silicon substrate 3 (see FIG. 9). In the case where the spacer 6 is to be formed of resin, the following is carried out. That is, the resin (spacer resin), which is to be the material of the spacer, is coated onto the front surface side, spread over the entire surface by spin coating or screen printing, and then cured. Thereafter, upon coating on a photosensitive resin (photoresist), a predetermined photomask is used to form a resist pattern corresponding to the spacer 6 that is to be formed by exposure and development, and using this mask, the spacer resin is made to remain just at predetermined regions to thereby form the spacer 6 of the predetermined pattern. Or, in the case where the resin of spacer 6 is photosensitive, the spacer can be obtained directly using a predetermined photomask to perform exposure and development and then performing curing in a suitable manner. By the provision of this spacer 6, the formed regions of the photodiodes 4 that make up the photodetecting portion are prevented from contacting a flat collet in the mounting process and are thus protected.

In the case where the spacer 6 is to be formed of a metal, in place of coating on and curing a spacer resin by the above-described procedure, a coating film of the metal that is to be the material of the spacer 6 is formed by vapor deposition, sputtering, CVD, or other method, a resist pattern is then formed by the above-described procedure, and using this pattern as a mask, the coating film is made to remain just at predetermined regions to form the spacer 6 of the predetermined pattern. In this case, the film thickness of the coating film may be made thick by plating. Also, though not illustrated, in the case where the spacer 6 is formed of metal, since when the spacer 6 contacts the electrode wiring 9 at the lower layer, the wiring will be shorted and become defective, a suitable insulating film is formed between the spacer 6 and the electrode wiring 9, etc. The insulating film is preferably one with good light transmitting characteristics, and may be a film of SiO$_2$, SiN, etc. that is formed by vapor deposition, sputtering, or CVD, or a film of a resin, such as a polyimide or an acrylate, and the film may be formed over the entire front surface of the photodiode array 1 or may be patterned so as to remain just at the necessary locations.

Figure 10:
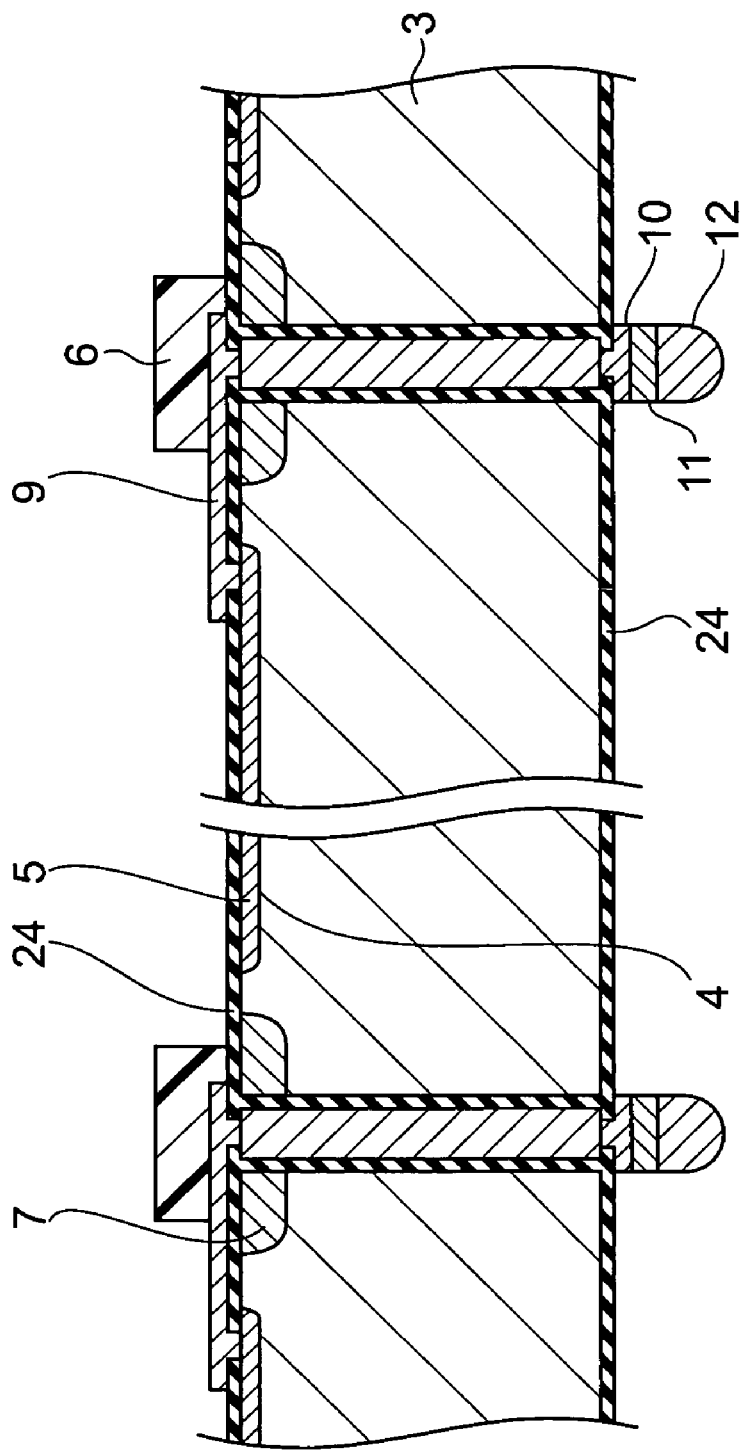
FIG. 10 is an enlarged sectional view of the principal portions that illustrates a step subsequent that of FIG. 9.

The bump electrodes 12 are then provided at the respective electrode pads 10, and in the case where solder is to be used as the bump electrodes 12, since solder is poor in wettability with respect to aluminum, the UBMs 11 for intervening between the respective electrode pads 10 and bump electrodes 12 are formed on the respective electrode pads 10 and bump electrodes 12 are formed overlappingly on UBMs 11(see FIG. 10). By the above steps, a photodiode array 1, with which noise due to damage during mounting will not be generated and which enables photodetection of high precision, can be manufactured.

Though in this case, the UBMs 11 are formed by electroless plating and using Ni—Au, the UBMs may be formed instead by the lift-off method and using Ti—Pt—Au or Cr—Au. In the case of forming the UBMs 11 by electroless plating, plating must be performed upon protecting the front surface and back surface by a insulating film so that just the portions at which the UBMs 11 are to be formed, that is, just the respective electrode pads 10 will be exposed. Also, the bump electrodes 12 are obtained by forming solder on predetermined the UBMs 11 by a solder ball mounting method or printing method and performing reflow. The bump electrodes 12 are not limited to those formed of solder and may be gold bumps, nickel bumps, or copper bumps or even conductive resin bumps, which contain a conductive filler or other metal.

Figure 14:
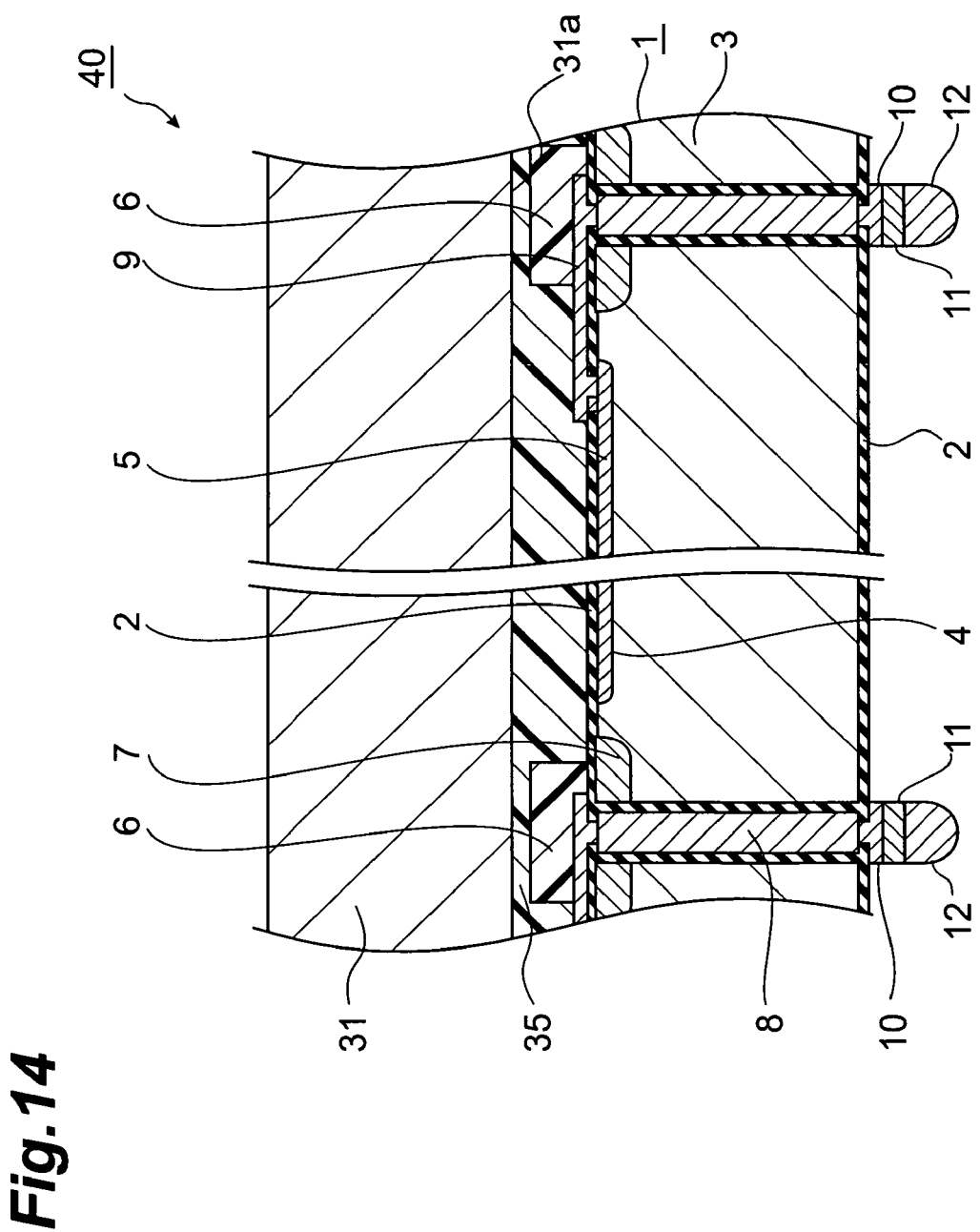
FIG. 14 is a sectional view showing, in enlarged and schematic manner, the principal portions of a radiation detector having a photo diode array of an embodiment.

An embodiment of this invention's radiation detector shall now be described. FIG. 14 is sectional side view of the radiation detector 40 of the embodiment. This radiation detector 40 has the scintillator panel 31, onto which radiation is made incident and which emits light, generated as a result of the radiation, from a light emitting surface 31a, and the above-described photodiode array 1, onto which the light emitted from the scintillator panel 31 is made incident and which converts the light to electrical signals. This radiation detector 40 is characterized in having this invention's photodiode array 1.

The scintillator panel 31 is mounted to the front surface side (incidence surface side) of the photodiode array 1, and the photodiode array 1 has the above-described spacer 6 disposed at its front surface side. Though the back surface of scintillator 31, that is, a light emitting surface 31a will thus contact the spacer 6, it will not contact the formed regions of the photodiodes 4 directly. Also, though gaps are formed by the light emitting surface 31a of the scintillator panel 31 and the spacer 6, an optical resin 35, having a refractive index such that will prevent the degradation of the light transmitting characteristics, is filled in these gaps, and by this optical resin 35, the light emitted from the scintillator panel 31 is made incident on the photodiode array 1 efficiently. As this optical resin 35, an epoxy resin, acrylic resin, urethane resin, silicone resin, fluorine resin, etc., having the property of transmitting the light emitted from the scintillator panel 31, may be used or a composite material having these resins as the base material may be used.

In bonding the photodiode array 1 onto an unillustrated mounting wiring substrate, the front surface is suctioned by a flat collet. However, since the above-described spacer 6 is provided on the front surface of the photodiode array 1, the suctioning surface of the flat collet will not contact the photodetecting portion directly, and direct contacting of the light emitting surface 31a with the formed regions of the photodiodes 4 due to the mounting of the scintillator 31 will also not occur. Since with the radiation detector 40, having such the photodiode array 1 and the scintillator panel 31, the generation of noise, dark current, etc. due to the damaging of the photodetecting portion in the mounting process can be prevented, photodetection can be performed with high precision and the detection of radiation can also be performed at high precision.

INDUSTRIAL APPLICABILITY

As has been described in detail above, by the present invention, the generation of noise, dark current, etc. due to the damaging of the photodetecting portion in the mounting process can be prevented effectively in a photodiode array, a method of manufacturing the same, and a radiation detector.

The invention claimed is:

1. A photodiode array comprising:
   a semiconductor substrate of a first conductive type, wherein a plurality of photodiodes are formed in array form on a surface onto which light to be detected is made incident; and
   the semiconductor substrate has penetrating wirings, which pass through from the light-incident surface side to a back surface side, formed for the photodiodes and
   a protruding portion, formed of an insulating resin and having a predetermined height, is formed at regions of the light-incident surface side at which the photodiodes are not formed,
   wherein each of the plurality of photodiodes is formed so as to add an impurity to a surface of one side of the semiconductor substrate to form a plurality of impurity diffusion layers of a second conductive type, and
   wherein the first conductive type is opposite to the second conductive type.

2. The photodiode array according to claim 1, wherein the protruding portion is formed of an insulating resin with a light shielding property.

3. The photodiode array according to claim 1 or 2, wherein the protruding portion comprises a plurality of spacer units and the respective spacer units are formed so as to be positioned intermittently at predetermined intervals.

4. The photodiode array according to claim 1 or claim 2, wherein the semiconductor substrate has impurity regions, which separate the respective photodiodes, disposed between the adjacent photodiodes.

5. A photodiode array manufacturing method comprising:
   a first step of forming, in a semiconductor substrate, formed of a semiconductor of a first conductive type, penetrating wirings that pass through between the respective surfaces of the semiconductor substrate;
   a second step of adding an impurity to predetermined regions of a surface at one side of the semiconductor substrate to form a plurality of impurity diffusion layers of a second conductive type and forming a plurality of photodiodes arranged in array form from the respective impurity diffusion layers and the semiconductor substrate; and
   a third step of providing on the surface at one side of the semiconductor substrate, a protruding portion formed of an insulating resin of predetermined height at the non-formed regions at which the photodiodes are not formed,
   wherein the first conductive type is opposite to the second conductive type.

6. The photodiode array manufacturing method according to claim 5, wherein
   the first step comprises: a step of forming a plurality of hole portions in the semiconductor substrate; a step of forming a conductive coating film on the surface of at least one side of the semiconductor substrate including the respective hole portions; and a step of polishing the semiconductor substrate to remove the conductive coating film.

7. The photodiode array manufacturing method according to claim 5 or 6, wherein a step subsequent to the first step is provided which add another impurity in between adjacent regions to which the impurity is to be added to form impurity regions of the first conductive type.

8. A radiation detector comprising:
   the photodiode array according to claim 1 or claim 2; and
   a scintillator panel, mounted to the side of the photodiode array onto which the light to be detected is made incident and emits light due to incident radiation.

9. A radiation detector, comprising:
   the photodiode array manufactured by the manufacturing method according to claim 5 or claim 6; and
   a scintillator panel, mounted to the side of the photodiode array at which the protruding portion is provided and emits light due to incident radiation.

10. A photodiode array comprising:
    a semiconductor substrate of a first conductive type, wherein a plurality of photodiodes are formed in array form on a surface onto which light to be detected is made incident; and
    the semiconductor substrate has penetrating wirings, which pass through from the light-incident surface side to a back surface side, formed for the photodiodes,
    a protruding portion, having a predetermined height, is formed of an insulating resin at regions of the light-incident surface side at which the photo diodes are not formed,
    a bump electrode is formed on the back surface side, and
    the protruding portion and the bump electrode are coaxially arranged with the penetrating wirings,
    wherein each of the plurality of photodiodes is formed so as to add an impurity to a surface of one side of the semiconductor substrate to form a plurality of impurity diffusion layers of a second conductive type, and
    wherein the first conductive type is opposite to the second conductive type.

11. A photodiode array manufacturing method comprising:
    a first step of forming, in a semiconductor substrate, formed of a semiconductor of a first conductive type, penetrating wirings that pass through between the respective surfaces of the semiconductor substrate;
    a second step of adding an impurity to predetermined regions of a surface at one side of the semiconductor substrate to form a plurality of impurity diffusion layers of a second conductive type and forming a plurality of photodiodes arranged in array form from the respective impurity diffusion layers and the semiconductor substrate;
    a third step of providing on the surface at one side of the semiconductor substrate, a protruding portion formed of an insulating resin of predetermined height at the non-formed regions at which the photodiodes are not formed; and
    a fourth step of providing a bump electrode on a back side of the surface at one side so that the protruding portion and the bump electrode are coaxially arranged with the penetrating wirings,
    wherein the first conductive type is opposite to the second conductive type.

* * * * *